United States Patent
Yang

(10) Patent No.: US 9,893,144 B1
(45) Date of Patent: Feb. 13, 2018

(54) METHODS FOR FABRICATING METAL-INSULATOR-METAL CAPACITORS

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/229,209

(22) Filed: Aug. 5, 2016

(51) Int. Cl.
  *H01L 29/00* (2006.01)
  *H01L 49/02* (2006.01)

(52) U.S. Cl.
  CPC .................. *H01L 28/60* (2013.01)

(58) Field of Classification Search
  CPC ..... H01L 51/0072; H01L 51/56; H01L 33/56; C09K 11/06; C09K 2211/1007
  USPC .......................................... 438/957; 257/532
  See application file for complete search history.

(56) References Cited

U.S. PATENT DOCUMENTS

| | | | |
|---|---|---|---|
| 5,675,184 A | 10/1997 | Matsubayashi et al. | |
| 5,879,985 A | 3/1999 | Gambino et al. | |
| 6,461,914 B1 | 10/2002 | Roberts et al. | |
| 6,492,240 B1* | 12/2002 | Wang | H01L 27/0629 257/E21.004 |
| 6,670,237 B1 | 12/2003 | Loh et al. | |
| 6,764,915 B2 | 7/2004 | Lee | |
| 2005/0227432 A1* | 10/2005 | Choi | H01L 21/31122 438/244 |
| 2007/0218626 A1* | 9/2007 | Lin | H01L 28/40 438/250 |
| 2009/0272961 A1* | 11/2009 | Miller | H01L 21/265 257/4 |
| 2011/0204475 A1* | 8/2011 | Rui | C01G 23/047 257/532 |
| 2012/0235276 A1* | 9/2012 | Rui | H01L 27/1085 257/532 |

* cited by examiner

*Primary Examiner* — Andy Huynh
(74) *Attorney, Agent, or Firm* — Louis J. Percello; Ryan, Mason & Lewis, LLP

(57) ABSTRACT

Semiconductor devices having MIM capacitor structures are provided, as well as methods for fabricating semiconductor devices having MIM capacitor structures. For example, a semiconductor device includes a first capacitor electrode formed on a substrate, a capacitor insulating layer formed on the first capacitor electrode, and a second capacitor electrode. The second capacitor electrode comprises a layer of metallic material that is formed by application of a surface treatment to a surface of the capacitor insulating layer to convert the surface of the capacitor insulating layer to the layer of metallic material. As an example, the capacitor insulating layer comprises $Ta_3N_5$ insulating material, and the second capacitor electrode comprises TaN metallic material.

14 Claims, 8 Drawing Sheets

US 9,893,144 B1

METHODS FOR FABRICATING METAL-INSULATOR-METAL CAPACITORS

TECHNICAL FIELD

This disclosure generally relates to semiconductor fabrication techniques and, in particular, techniques for fabricating MIM (metal-insulator-metal) capacitors.

BACKGROUND

Capacitors are passive circuit components that are utilized in integrated circuity of a semiconductor chip for various purposes. For example, capacitors can be utilized to decouple power supplies, to form memory elements, to form RC delay circuits, or provide various other circuit functions. While many types of capacitor structures can be utilized, MIM capacitors are commonly used for analog, microwave, and RF (radio frequency) applications. MIM capacitors are comprised of two metal plates separated by an insulator material. The fabrication of planar MIM capacitors using conventional CMOS technologies requires multiple deposition and lithographic masking steps, which is time consuming and expensive. In this regard, the amount and complexity of additional processing steps that are incorporated as part of a semiconductor process flow to fabricate MIM capacitors should be minimized to reduce the fabrication costs and processing time for constructing semiconductor chips.

SUMMARY

Embodiments of the invention include semiconductor devices having MIM capacitor structures, as well as methods for fabricating semiconductor devices having MIM capacitor structures. In one embodiment, a method for fabricating a semiconductor device includes forming a first capacitor electrode on a substrate, and forming a capacitor insulating layer over the first capacitor electrode. The capacitor insulating layer is formed with an initial thickness T. A surface treatment is applied to a surface of the capacitor insulating layer to convert the surface of the capacitor insulating layer to a layer of metallic material of thickness $T_1$, which is less than T. The layer of metallic material comprises a second capacitor electrode.

Another embodiment of the invention includes a semiconductor device. The device includes a first capacitor electrode formed on a substrate, a capacitor insulating layer formed on the first capacitor electrode, and a second capacitor electrode. The second capacitor electrode comprises a layer of metallic material that is formed by application of a surface treatment to a surface of the capacitor insulating layer to convert the surface of the capacitor insulating layer to the layer of metallic material. In one example embodiment, the capacitor insulating layer comprises $Ta_3N_5$ insulating material, and the second capacitor electrode comprises TaN metallic material.

In one embodiment, the first capacitor electrode, the capacitor insulating layer, and the second capacitor electrode comprise a MIM capacitor structure that is formed as part of a MOL (middle-of-the-line) layer of a semiconductor device.

In another embodiment, the first capacitor electrode, the capacitor insulating layer, and the second capacitor electrode comprise a MIM capacitor structure that is formed as part of a BEOL (back-end-of-line) layer of a semiconductor device.

Other embodiments will be described in the following detailed description of embodiments, which is to be read in conjunction with the accompanying figures.

BRIEF DESCRIPTION OF THE DRAWINGS

FIGS. 2 through 8 schematically illustrate a method for fabricating the semiconductor device of FIG. 1, according to an embodiment of the invention, wherein:

FIG. 2 schematically illustrates the semiconductor device of FIG. 1 at an intermediate stage of fabrication after depositing a first insulating layer on a substrate and patterning the first insulating layer to form an opening that is to be filled with metallic material to form a first capacitor electrode structure of the MIM capacitor structure;

FIG. 3 is cross-sectional schematic side view of the semiconductor structure of FIG. 2 after sequentially depositing a conformal layer of liner material and a layer of metallic material to fill the opening in the first insulating layer;

FIG. 4 is cross-sectional schematic side view of the semiconductor structure of FIG. 3 after planarizing the surface of the semiconductor structure to form the first capacitor electrode and after depositing a layer of insulating material which is subsequently processed to form a capacitor insulating layer and a second capacitor electrode of the MIM capacitor structure;

FIG. 5 is cross-sectional schematic side view of the semiconductor structure of FIG. 4, which shows a controlled surface treatment being applied to the layer of insulating material to convert an upper portion of the layer of insulating material to a thin layer of metallic material and, thereby, form a stacked layer of insulating and metallic material;

FIG. 6 is a cross-sectional schematic side view of the semiconductor structure of FIG. 5 after patterning the stacked layer of insulating and metallic material to form the capacitor insulating layer and the second capacitor electrode of the MIM capacitor structure;

FIG. 7 schematically illustrates the semiconductor structure of FIG. 6 after depositing and planarizing a layer of insulating material to form a second insulating layer; and FIG. 8 is a cross-sectional side view of the semiconductor structure of FIG. 7 after pattering the second insulating layer to form a contact opening and depositing a conformal layer of liner material and layer of metallic material to fill the contact opening in the second insulating layer with metallic material to form a device contact structure.

DETAILED DESCRIPTION

Figure 1:
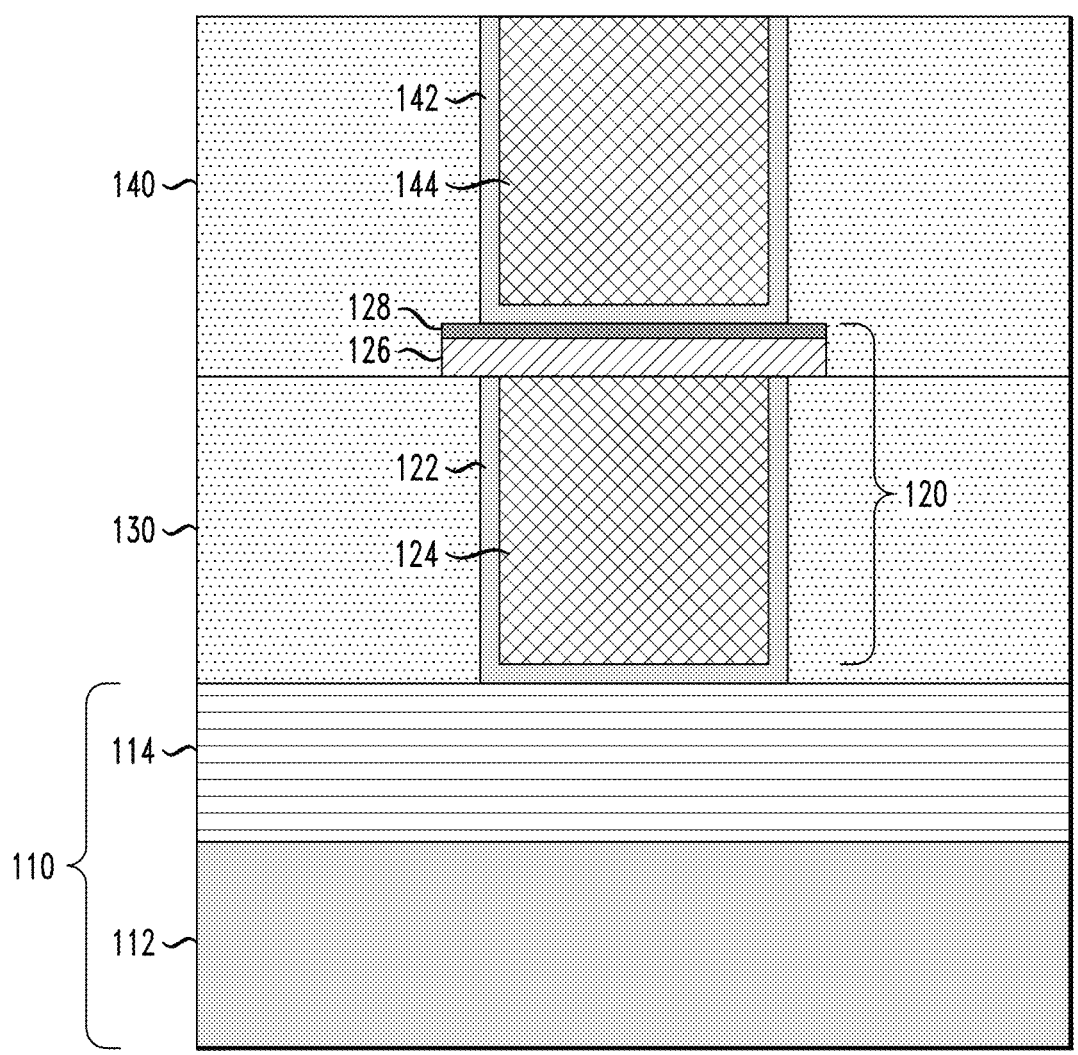
FIG. 1 is cross-sectional schematic view of a semiconductor device comprising a MIM capacitor structure according to an embodiment of the invention.

Embodiments will now be described in further detail with regard to semiconductor integrated circuit devices having MIM capacitor structures that are formed as part of BEOL (back-end-of-line) and/or MOL (middle-of-the-line) layers, as well as methods for fabricating MIM capacitor structures as part of BEOL and/or MOL layers of a semiconductor integrated circuit device. In particular, as explained in further detail below, embodiments of the invention include methods to fabricate a MIM capacitor structure in which a single deposition step is utilized to form a capacitor insulating layer and a metallic plate of the MIM capacitor structure. For example, a process flow includes depositing a layer of insulating material on a first metallic plate of the MIM capacitor structure. A controlled surface treatment is then performed to convert a surface of the insulating layer into a metallic layer which serves as a second metallic plate of the MIM capacitor, wherein the remaining, unconverted portion of the insulating layer serves as the capacitor insulating layer of the MIM capacitor structure. This process enables precise control of the thickness of the insulating layer of the MM capacitor structure and thus, allows for scalability of ultra-thin insulator layers for enhanced performance of MIM capacitors.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIG. 1 is cross-sectional schematic side view of a semiconductor device comprising a MIM capacitor structure, according to an embodiment of the invention. In particular, FIG. 1 schematically illustrates a semiconductor device 100 comprising a substrate 110, a MIM capacitor structure 120, a first insulating layer 130, and a second insulating layer 140. The MIM capacitor structure 120 comprises a first capacitor electrode 122/124 (or first metallic plate) embedded in the first insulating layer 130, a capacitor insulating layer 126, and a second capacitor electrode 128 (or second metallic plate), wherein the capacitor insulating layer 126 is disposed between the first capacitor electrode 122/124 and the second capacitor electrode 128. The semiconductor device 100 further comprises a contact electrode 142/144 (alternatively referred to as upper contact electrode) embedded in the second insulating layer 140 and in electrical contact with the second capacitor electrode 128 of the MIM capacitor structure 120. In the example embodiment of FIG. 1, the first capacitor electrode 122/124 serves as lower metallic plate of the MIM capacitor structure 120 as well as a lower contact electrode to the MIM capacitor structure 120. In one embodiment, the first capacitor electrode 122/124 comprises a vertical conductive via contact that is formed in the first insulating layer 130.

The first capacitor electrode 122/124 comprises a liner layer 122 and a metallic material 124. The first capacitor electrode 122/124 is formed by etching an opening (e.g., trench or via) in the first insulating layer 130, lining the opening with a conformal layer of liner material to form the liner layer 122, and filling the opening with the metallic material 124. Similarly, the contact electrode 142/144 comprises a liner layer 142 and a metallic material 144. The contact electrode 142/144 is formed by etching an opening (e.g., trench or via) in the second insulating layer 140, lining the opening with a conformal layer of liner material to form the liner layer 142, and filling the opening with the metallic material 144. The liner layers 122 and 142 serve as barrier diffusion layers to prevent migration of the metallic materials 124 and 144 (e.g., Cu) into the insulating layers 130 and 140, as well as adhesion layers to provide good adhesion to the metallic materials 124 and 144 (e.g., Cu) that are used to fill the openings that are formed in the insulating layers 130 and 140.

As explained in further detail with reference to FIGS. 4-6, for example, the capacitor insulating layer 126 and the second capacitor electrode 128 are formed using a single deposition step, wherein a thin layer of insulating material is deposited over the surface of the first insulating layer 130 and the first capacitor electrode 122/124. A controlled surface treatment is then performed to convert an upper surface of the thin layer of insulating material into a metallic layer which serves as the second capacitor electrode 128. The underlying portion of the thin layer of insulating material, which is not converted to a metallic material, serves as the capacitor insulating layer 126 of the MIM capacitor structure 120.

The MIM capacitor structure 120 can be integrally formed as part of a MOL and/or a BEOL process flow. In this regard, in one embodiment, the first and second insulating layers 130 and 140 may be PMD (pre-metal dielectric) layers that are part of a MOL layer of the semiconductor device 100. In another embodiment, the first and second insulating layers 130 and 140 may be ILD (interlevel dielectric) layers that are part of a BEOL layer of the semiconductor device 100. In another embodiment, the first insulating layer 130 may be part of a MOL layer, and the second insulating layer 140 may be part of the first interconnect level of a BEOL layer.

The substrate 110 is generically depicted in FIG. 1 as comprising an underlying base semiconductor substrate 112 (e.g., semiconductor wafer) and a device/layer stack 114 comprising integrated circuity and interconnect layers/structures that are formed on the base semiconductor substrate 112 prior to formation of the first insulating layer 130. In this regard, the base semiconductor substrate 112 may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the base semiconductor substrate 112 may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL (front-end-of-line layer.

The device/layer stack 114 comprises a FEOL layer, a MOL layer (or at least a portion of the MOL layer), and/or a BEOL layer (or at least a portion of the BEOL layer). As is known in the art, a FEOL layer comprises various semiconductor devices and components that are formed in or on the active surface of the semiconductor substrate 112 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 112. In general, FEOL processes typically include preparing the semiconductor substrate 112 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

Furthermore, a MOL layer is formed on the FEOL layer. In general, the MOL layer comprises one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure.

A BEOL structure is formed on the FEOL/MOL structure to connect the various integrated circuit components of the FEOL layer. As is known in the art, a BEOL structure comprises multiple levels dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In one example embodiment, the MIM capacitor structure 120 shown in FIG. 1 can be integrally formed as part of a MOL process flow in which the contact structures 122/124 and 142/144 are integrally formed as part of the metallization and dielectric layers that are used to form other MOL device contacts and devices/components that are integrated within the MOL layer. In another embodiment, the MIM capacitor structure 120 can be integrally formed as part of a BEOL process flow in which the contact structures 122/124 and 142/144 are integrally formed as part of the metallization and dielectric layers that are used to form BEOL interconnect structures (e.g., wiring and vertical vias). Advantageously, embodiments of the invention allow MIM capacitors to be fabricated as using standard MOL and/or BEOL interconnect process flows, which reduces processing costs and time for manufacturing MIM capacitors which are normally fabricated in different process flows.

Figure 2:
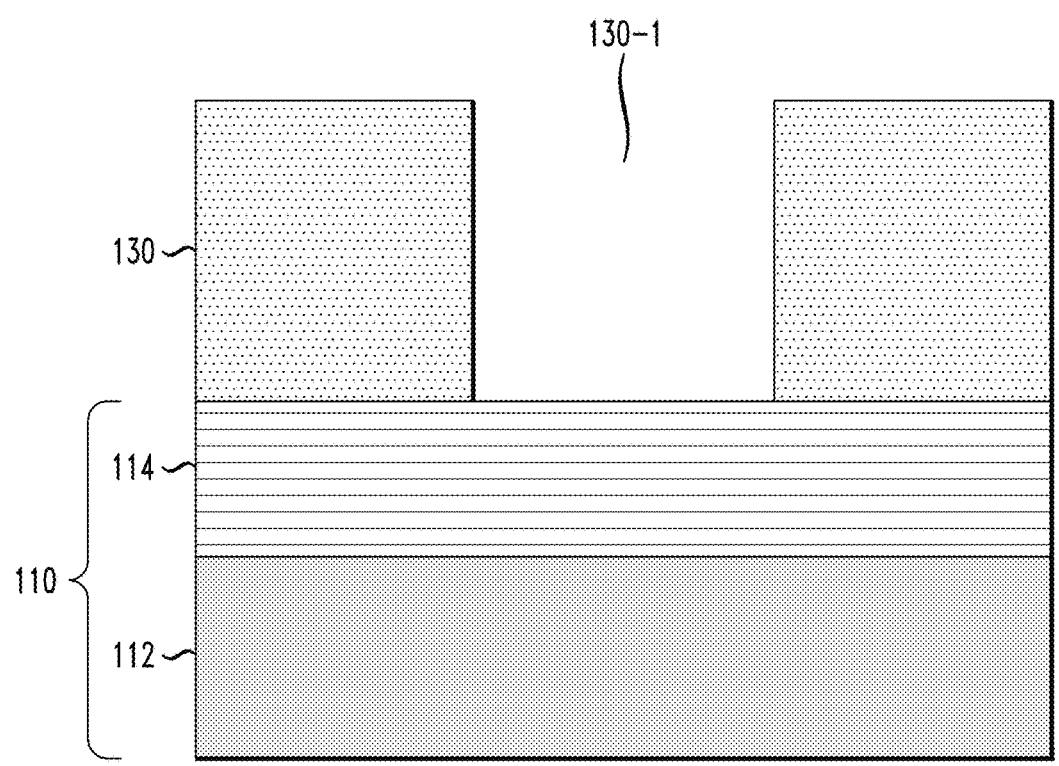

Methods for fabricating the semiconductor device 100 of FIG. 1 will now be discussed in further detail with reference to FIGS. 2 through 8, which schematically illustrate the semiconductor device 100 of FIG. 1 at various stages of fabrication. To begin, FIG. 2 schematically illustrates the semiconductor device 100 of FIG. 1 at an intermediate stage of fabrication after depositing the first insulating layer 130 on the substrate 110 and patterning the first insulating layer 130 to form an opening 130-1 that is to be filled with metallic material to form the first capacitor electrode 122/124 of the MIM capacitor structure 120. In alternate embodiments of the invention, it is assumed that the substrate layer 114 in FIG. 2 comprises, for example, a FEOL layer only, or a FEOL layer and at least initial layers of a MOL layer, or a FEOL layer and completed MOL layer, or a FEOL layer, MOL layer, and initial layers of a BEOL layer. In such embodiments, the first insulating layer 130 is deposited and patterned as part of a MOL process module or BEOL process module.

The first insulating layer 130 can be formed using any suitable dielectric material including, but not limited to, silicon oxide (e.g. SiO2), SiN (e.g., (Si3N4), hydrogenated silicon carbon oxide (SiCOH), silicon based low-k dielectrics, porous dielectrics, or other known ULK (ultra-low-k) dielectric materials. The first insulating layer 130 can be deposited using known deposition techniques, such as, for example, ALD (atomic layer deposition), CVD (chemical vapor deposition) PECVD (plasma-enhanced CVD), or PVD (physical vapor deposition). The thickness of the first insulating layer 130 will vary depending on the application, and may have a thickness in a range of about 30 nm to about 200 nm, for example. Furthermore, the first insulating layer 130 can be patterned using any suitable masking (e.g., photoresist mask) and etching technique (e.g., RIE (reactive ion etch)) to etch a pattern of openings (e.g., trenches or vias) in the first insulating layer 130, wherein such openings include the opening 130-1 shown in FIG. 2. For example, a dry etch technique using a fluorine-based etchant can be used to etch away the dielectric material of the first insulating layer 130 to form the opening 130-1.

Figure 3:
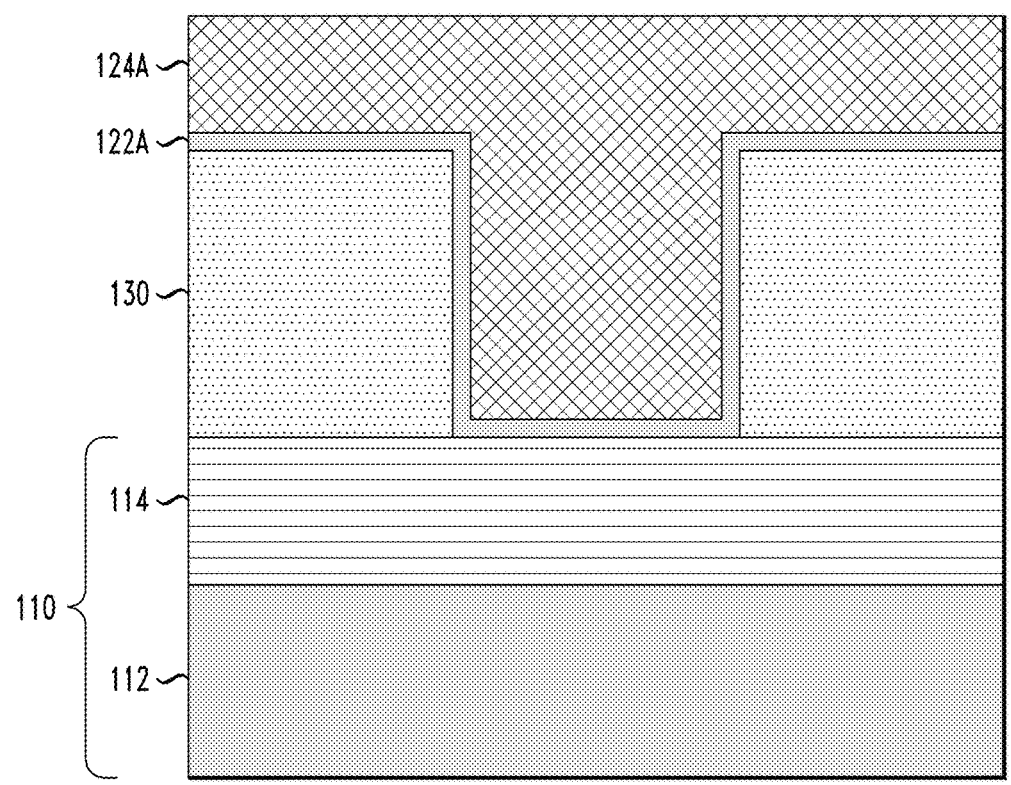

Next, FIG. 3 is cross-sectional schematic side view of the semiconductor structure of FIG. 2 after sequentially depositing a conformal layer of liner material 122A and a layer of metallic material 124A to fill the opening 130-1 in the first insulating layer 130. In particular, as shown in FIG. 3, the conformal layer of liner material 122A is deposited to line the sidewall and bottom surfaces of the opening 130-1 in the first insulating layer 130 with a thin liner. The liner material may include one or more thin layers of material such as, for example, tantalum nitride (TaN), titanium nitride (TiN), cobalt (Co), ruthenium (Ru), tungsten nitride (WN), manganese (Mn), manganese nitride (MnN) or other liner materials (or combinations of liner materials) such as RuTaN, Ta/TaN, CoWP, NiMoP, NiMoB) which are suitable for the given application. As noted above, the thin liner layer serves as a barrier diffusion layer and adhesion layer. The conformal layer of liner material 122A is deposited using known techniques such as CVD, ALD, PVD, etc.

Moreover, the layer of metallic material 124A comprises a metallic material such as, e.g., copper (Cu), aluminum (Al), tungsten (W), cobalt (Co), ruthenium (Ru), iridium (Ir), rhodium (Rh), nickel (Ni), or alloys thereof. The layer of metallic material 124A is deposited using known techniques such as electroplating, electroless plating, CVD, PVD, or a combination of methods. The type of metallic material 124A and deposition method used to deposit the layer of metallic material may depend on whether the process steps of FIGS. 2 and 3 are part of a MOL process flow or BEOL process flow. Prior to filling the opening 130-1 in the first insulating layer 130 with the conductive material 124A, a thin seed layer (e.g., Cu seed layer) may optionally be deposited (on the conformal liner layer 122A) using a suitable deposition technique such as ALD, CVD or PVD. The seed layer can be formed of a material which enhances adhesion of the metallic material on the underlying material and which serves as catalytic material during a subsequent plating process.

For example, a thin conformal Cu seed layer can be deposited over the surface of liner layer 122A using PVD, followed by the electroplating of Cu to fill the openings (e.g., opening 130-1) patterned in the first insulating layer 130 and, thus, form a Cu metallization layer. The overburden liner, seed, and metallization materials are then removed by performing a chemical mechanical polishing process (CMP) to planarize the surface of the semiconductor structure down to the first insulating layer 130 and form the first capacitor electrode 122/124, as shown in FIG. 4.

Figure 4:
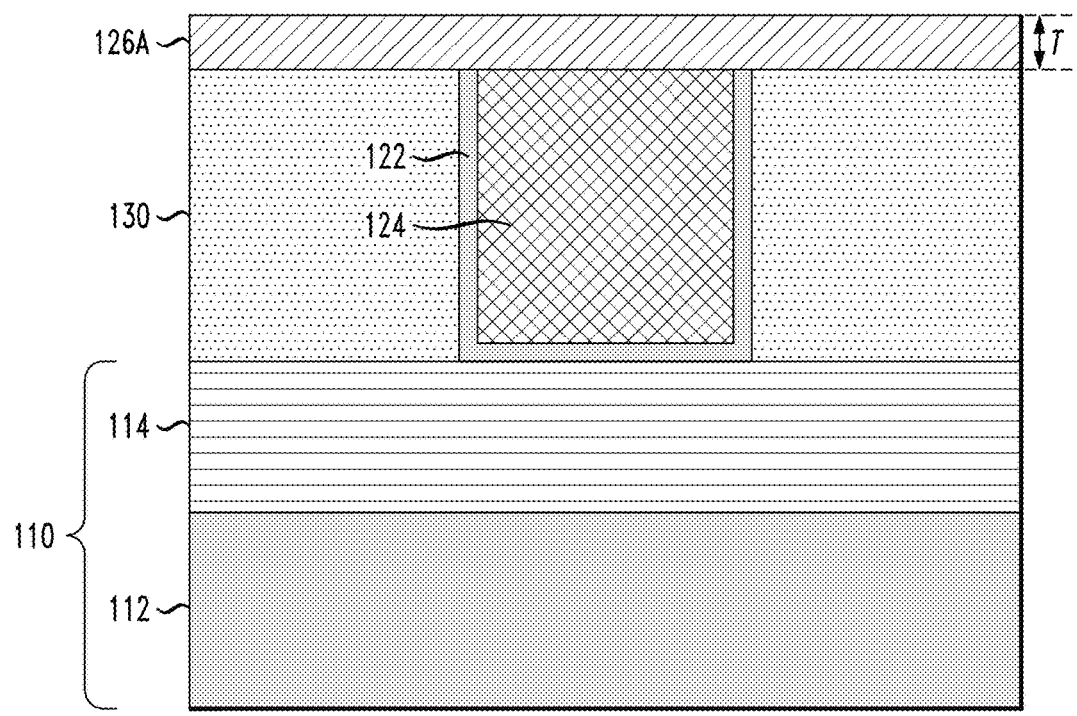

In particular, FIG. 4 is cross-sectional schematic side view of the semiconductor structure of FIG. 3 after planarizing the surface of the semiconductor structure to form the first capacitor electrode 122/124 of the MIM capacitor structure 120, and after depositing a thin layer of insulating material 126A, which is subsequently processed to form the capacitor insulating layer 126 and the second capacitor electrode 128 (in the form of a thin metallic plate) of the MIM capacitor structure 120. As shown in FIG. 4, the layer of insulating material 126A is formed with an initial thickness T, wherein the thickness T is in a range of about 3 nm to about 10 nm. In one embodiment of the invention, the layer of insulating material 126A comprises a material having an amorphous/orthorhombic crystal lattice structure. In particular, in one example embodiment, the layer of insulating material 126A comprises $Ta_3N_5$. In other embodiments, the layer of insulating material 126A may include, e.g., TaNO TiNO, AlNO, MnNO, NiNO, or WNO. The layer of insulating material 126A can be deposited using ALD, CVD, PVD, or other suitable deposition methods. A controlled surface treatment is applied to the upper surface of the layer of insulating material 126A to convert the surface of the insulating layer 126A to a layer of metallic material that serves as the second capacitor electrode of the MIM capacitor structure 120.

Figure 5:
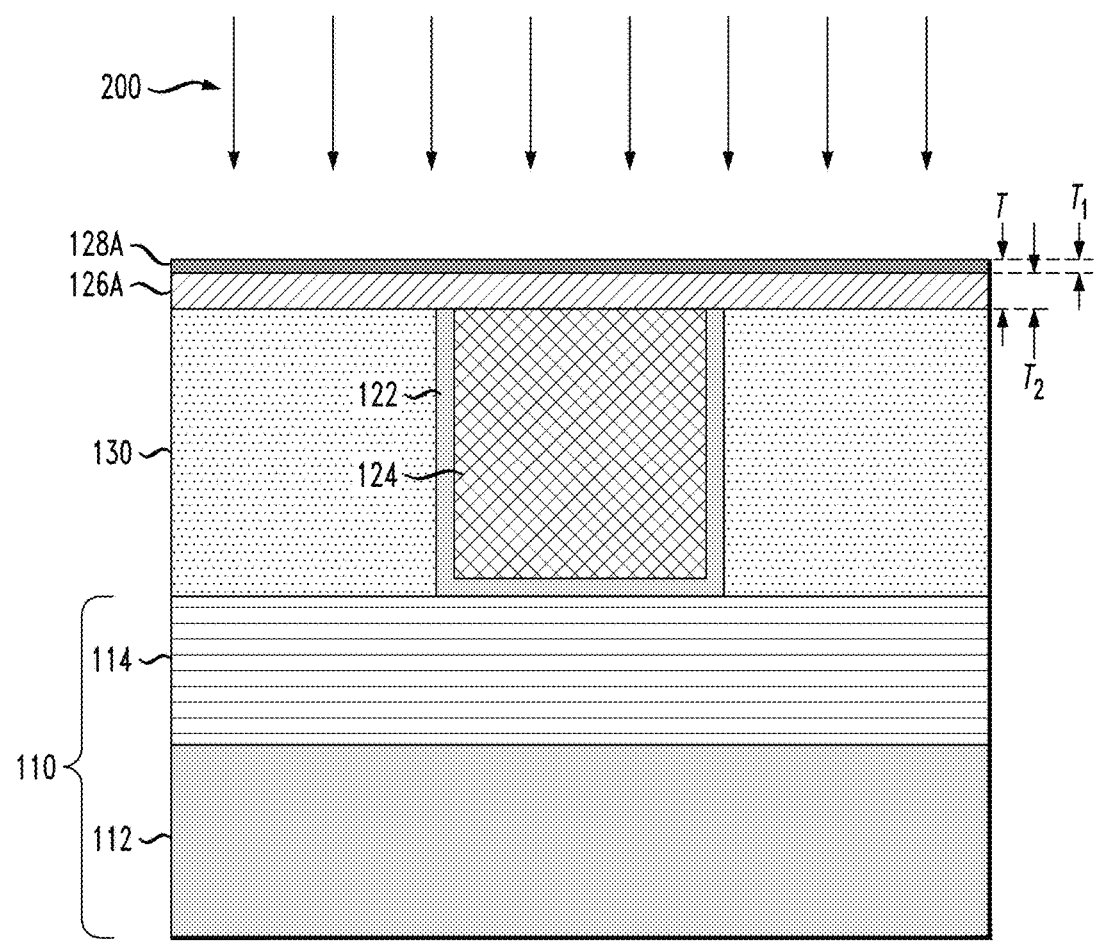

In particular, FIG. 5 is cross-sectional schematic side view of the semiconductor structure of FIG. 4, which shows a controlled surface treatment 200 being applied to the layer of insulating material 126A to convert an upper portion of the layer of insulating material 126A into a thin layer of metallic material 128A. As shown in FIG. 5, at the completion of the controlled surface treatment 200, the layer of metallic material 128A has a thickness $T_1$, and a remaining (unconverted) portion of the layer of insulating material 126A has a thickness $T_2$, which is less than the original thickness T of the layer of insulating material 126A (as shown in FIG. 4), wherein $T=T_1+T_2$. For example, in one embodiment where the original thickness T of the layer of insulating material 126A is in a range of about 3 nm to about 10 nm, the controlled surface treatment 200 allows the formation of the layer of metallic material 128A having a thickness $T_1$ which is about 3 nm or less.

The controlled surface treatment 200 serves multiple purposes. For example, the controlled surface treatment 200 allows precise control of the thickness $T_2$ of the remaining portion of the layer of insulating material 126A, wherein the parameters of the controlled surface treatment 200 can be selected to precisely control the depth (e.g., thickness $T_1$) of the transformation from insulating material to metallic material. As is known in the art, the capacitance of a MIM capacitor structure 120 as shown in FIG. 1 is directly proportional to the surface area (A) of the overlap between the first capacitor electrode 122/124 and the second capacitor electrode 128, directly proportional to the dielectric constant of the insulating material of the capacitor insulating layer 126, and inversely proportional to the thickness (e.g., thickness $T_2$) of the capacitor insulating layer 126. In this regard, the controlled surface treatment 200 provides an optimal process control for fabricating an ultrathin capacitor insulating layer 126 with a target thickness $T_2$ for nano-scale MIM capacitor structures, as opposed to simply depositing an ultrathin capacitor insulating layer using standard deposition methods which provide less-precision thickness control.

Moreover, the controlled surface treatment 200 eliminates the need for two separate deposition processes to deposit an insulating layer and a metallic layer to form the capacitor insulating layer 126 and the second capacitor electrode 128, respectively, of the MIM capacitor structure 120. With the methods described herein, a single deposition process (e.g., FIG. 4) is performed to deposit a layer of insulating material, which is transformed into the capacitor insulating layer 126 and the second capacitor electrode 128, respectively, of the MIM capacitor structure 120 using a controlled surface treatment process according to an embodiment of the invention.

In general, the controlled surface treatment 200 shown in FIG. 5 is applied to transform the amorphous/orthorhombic crystal lattice structure of the upper surface portion of the layer of insulating material 126A into a metallic material having a polycrystalline/cubic crystal lattice structure. For example, in one embodiment of the invention, when the layer of insulating material 126A is formed of $Ta_3N_5$, the surface treatment 200 can be implemented to convert the insulating material $Ta_3N_5$ into a TaN metallic material, which has a cubic lattice structure. Similarly, when the layer of insulating material 126A is formed of other materials such as TaNO TiNO, AlNO, MnNO, NiNO, or WNO, the surface treatment modifies the composition/concentration of the constituent elements of the insulating materials in a way that transforms the insulating material into a metallic material with a lattice structure of the insulating material transformed from an amorphous/orthorhombic structure into a polycrystalline/cubic structure.

The controlled surface treatment 200 of FIG. 5 can be implemented using various methods. For example, the controlled surface treatment 200 can be implemented using a plasma bombardment process, an ion implantation process, a gas cluster ion beam (GCIB) process, or a neutral atom beam (NAB) technique. In general, these surface treatment techniques involve a bombardment process in which the surface of the insulating material layer 126A is bombarded with high energy particles to cause transformation of the insulating material into metallic material.

For example, for a plasma treatment process, a plasma can be generated using a precursor gas such as $N_2$, $HH_3$, $H_2$, $N_2H_2$, or mixtures thereof, etc. in an inert atmosphere of He or Ar. In addition, in one embodiment, the plasma treatment is performed in a suitable chamber at a temperature in a range of about 50 degrees Celsius to about 600 degrees Celsius, with a plasma energy in a range of about 0.1 keV to about 2.0 keV. A plasma process enables the surface of insulating material layer 126A to be chemically altered through infusion at a controlled penetration depth of about 10 nm to about 100 nm. Similarly, an ion implantation process can be implemented with a suitable mixture of gases (as noted above) and an energy in a range of about 10 keV to about 200 keV to chemically alter the surface of the insulating material layer 126A through infusion at a controlled penetration depth of 50 nm to about 1000 nm.

The GCIB and NAB treatment methods are technologies that enable nano-scale modification of surfaces, e.g., chemically alter surfaces through infusion. With GCIB, a surface of the insulating material layer 126A is bombarded by a beam of high energy nanoscale cluster ions, which are formed when a high pressure gas (e.g., 10 atmospheres pressure) expands into a vacuum. In one example embodiment, a GCIB treatment can be implemented with a suitable mixture of gases (as noted above) and an energy in a range of about 10 keV to about 30 keV to chemically alter the surface of the insulating material layer 126A through infusion at a controlled penetration depth of less than about 10 nm. Similarly, a NAB surface treatment enables ultra-shallow processing of surfaces by converting energized gas cluster ions produced by a GCIB method into intense collimated beams of coincident neutral gas atoms having controllable average energies from about 10 eV per atom to about 100 eV per atom. An electrostatic deflector is used to eliminate charged species in the environment, while allowing the released neutral atoms to bombard the target surface and produce effects similar to those normally associated with GCIB, but to shallower depths (e.g., about 3 nm or less).

Figure 6:
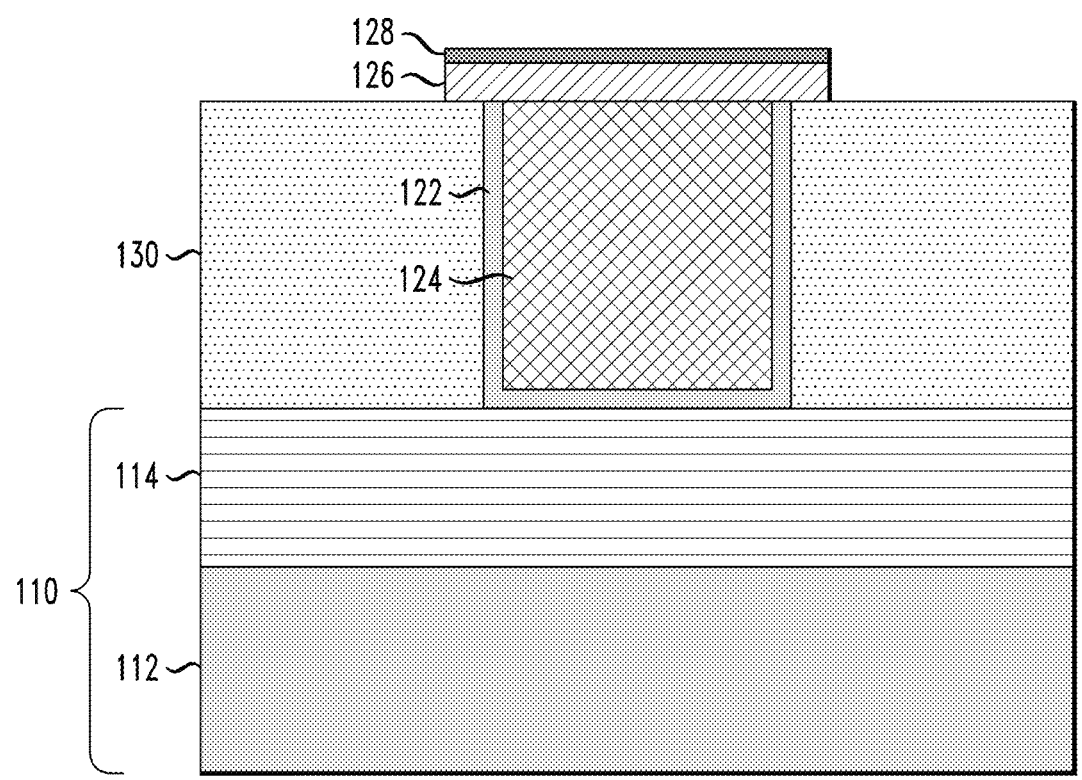

Following completion of the controlled surface treatment 200, the resulting stacked layer of insulating material 126A and metallic material 128A (in FIG. 5) is patterned to form the capacitor insulating layer 126 and the second capacitor electrode 128 of the MIM capacitor structure 120, resulting in the semiconductor structure shown in FIG. 6. The stacked layer of insulating material 126A and metallic material 128A can be patterned using standard photolithographic methods. Following the patterning process, a layer of insulating material is deposited over the semiconductor structure shown in FIG. 6, and then planarized to form the semiconductor structure shown in FIG. 7.

Figure 7:
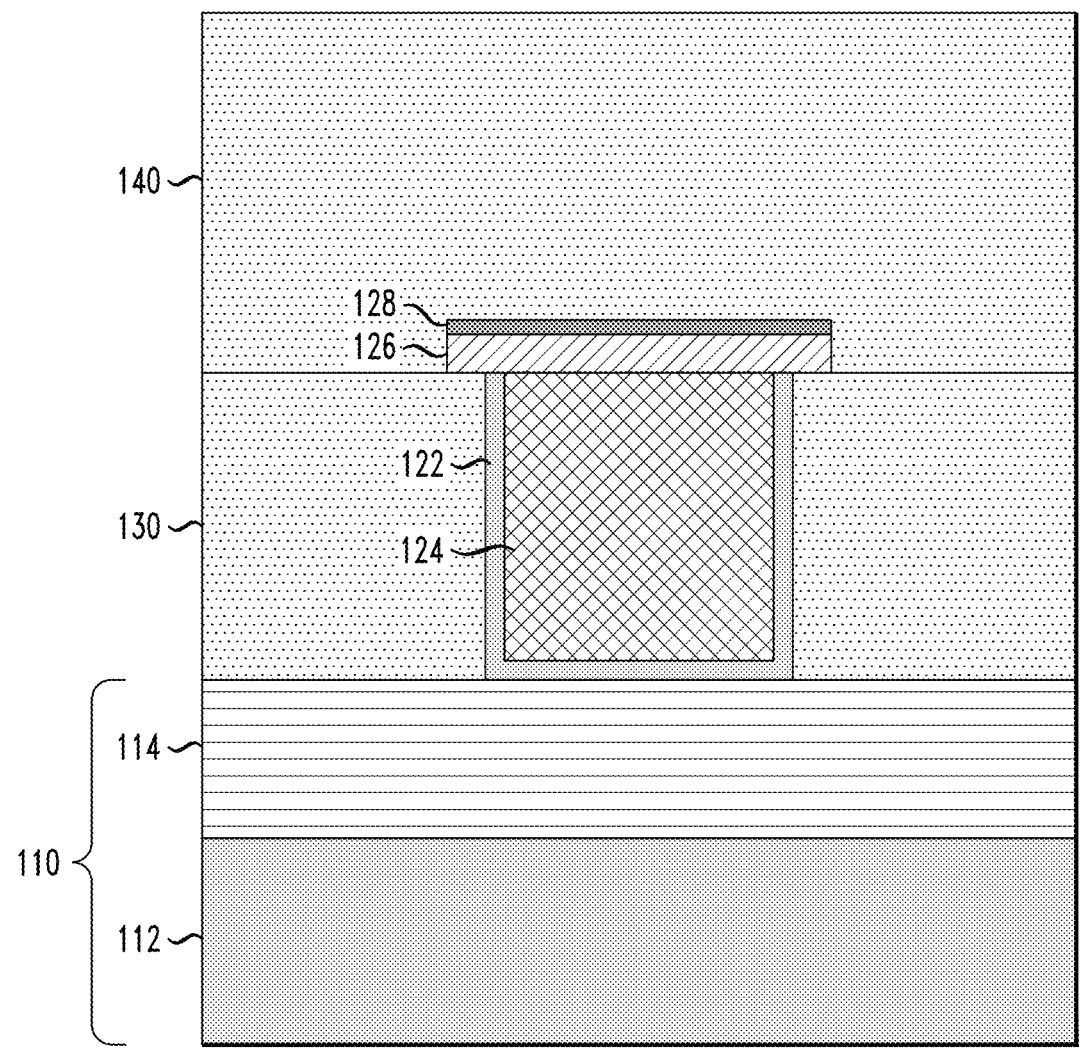

In particular, FIG. 7 schematically illustrates the semiconductor structure of FIG. 6 after depositing and planarizing insulating material to form the second insulating layer 140. The second insulating layer 140 can be formed using any suitable dielectric material including, but not limited to, SiO2, SiN, SiCOH, silicon based low-k dielectrics, porous dielectrics, or other known ULK dielectric materials. The second insulating layer 140 can be deposited using known deposition techniques, such as, for example, ALD, CVD, PECVD, or PVD, etc. The thickness of the second insulating layer 140 will vary depending on the application, and may have a thickness in a range of about 30 nm to about 500 nm, for example.

It is to be understood that in other embodiments of the invention, a thin dielectric capping layer (not shown) may be formed over the semiconductor structure of FIG. 6 prior to forming the second insulating layer 140. The dielectric capping layer would serve to insulate exposed surface portions of the metallization formed in the first insulating layer 130 from the dielectric material of the second insulating layer 140. For example, in a BEOL structure using copper material to form the metallization (e.g., metallization 124 of the first capacitor electrode 122/124) in the first insulating layer 130, the dielectric capping layer serves to improve interconnect reliability and prevent copper metallization from diffusing into the material of the second insulating layer 140. The dielectric capping layer could be formed of silicon nitride (SiN), silicon carbide (SiC), silicon carbon nitride (SiCN), hydrogenated silicon carbide (SiCH), a multilayer stack comprising the same or different types of dielectric materials, etc., and deposited using standard deposition techniques, for example, chemical vapor deposition. The capping layer 148 can be formed with a thickness in a range from about 2 nm to about 60 nm. On the other hand, if the metallic material used to form the metallization structures in the first insulating layer 130 is formed of tungsten, for example, the second insulating layer 140 could be deposited directly on the first insulating layer 130 (without having to form an additional capping layer) as tungsten is not reactive with typical dielectric materials that are used to form the second insulating layer 140.

Figure 8:
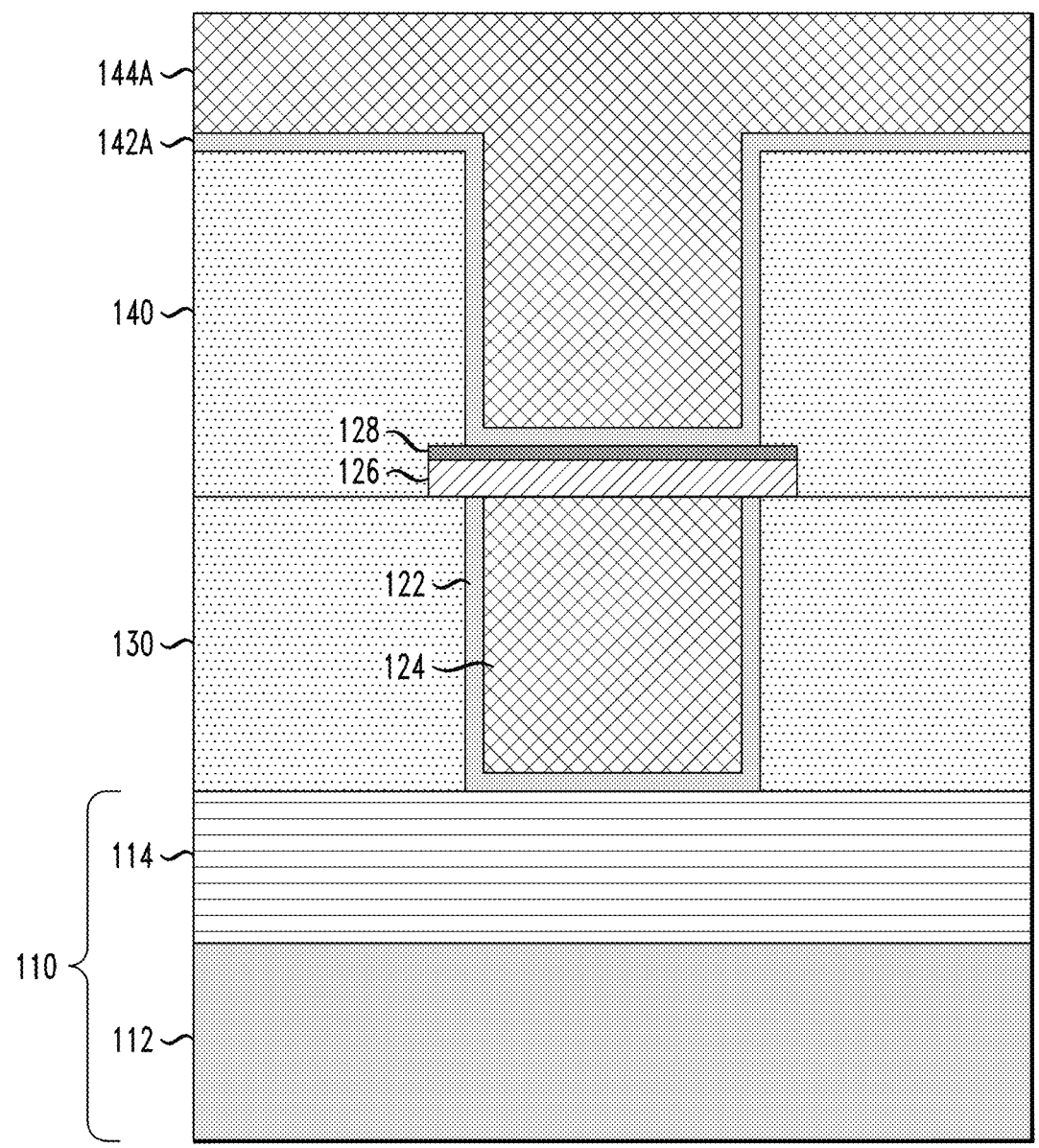

Following deposition and planarization of the second layer of insulating material 140, an etch process is performed to pattern openings (trenches and vias) in the second insulating layer 140 using techniques as discussed above with reference to FIG. 2. The pattern of openings in the second insulating layer 140 include a contact opening that is aligned to the underlying second capacitor electrode 128, and this contact opening is lined with a thin layer of liner material and filled with a metallic material to form the upper contact 142/144 shown in FIG. 1. For example, FIG. 8 is a cross-sectional side view of the semiconductor structure of FIG. 7 after depositing a conformal layer of liner material 142A to line the sidewall and bottom surfaces of the contact opening, and depositing a layer of metallic material 144A to fill the contact opening above the second capacitor electrode 128 with the metallic material. The liner material 142A and metallic material 144A may be formed of the same or similar materials as the liner and metallic materials used to form the first capacitor electrode 122/124. Following deposition of the layer of liner material 142A and the layer of metallic material 144A, the semiconductor structure shown in FIG. 8 is planarized (e.g., via CMP) down to the surface of the second insulating layer 140, resulting in the semiconductor device shown in FIG. 1.

Following the formation of the semiconductor structure shown in FIG. 1, one or more additional interconnect levels can be formed over the second insulating layer 140 using standard MOL and/or BEOL process flows. The first capacitor electrode 122/124 can be electrically connected to terminals of active/passive components that are formed in the FEOL layer using wiring that is formed within the substrate layer 114. The upper contact structure 142/144 can be connected to other components through wiring structures that are formed in the second insulating layer 140 and/or wiring structures that are formed in upper interconnect levels formed above the second insulating layer 140.

It is to be understood that the methods discussed herein for fabricating MIM capacitor structures in MOL or BEOL layers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

I claim:

1. A method, comprising:
   forming a first insulating layer on a substrate;
   forming a first capacitor electrode in the first insulating layer;
   forming a capacitor insulating layer over the first capacitor electrode, wherein the capacitor insulating layer is formed with an initial thickness T; and
   applying a surface treatment to a surface of the capacitor insulating layer to convert the surface of the capacitor insulating layer to a layer of metallic material of thickness $T_1$, which is less than T;
   wherein the layer of metallic material comprises a second capacitor electrode.

2. The method of claim 1, further comprising:
   forming a second insulating layer over the second capacitor electrode; and
   forming a conductive contact in the second insulating layer in electrical contact with the second capacitor electrode.

3. The method of claim 2, wherein the first insulating layer, the second insulating layer, the first capacitor electrode, and the conductive contact are formed as part of a MOL (middle-of-the-line) layer of a semiconductor device.

4. The method of claim 2, wherein the first insulating layer, the second insulating layer, the first capacitor electrode, and the conductive contact are formed as part of a BEOL (back-end-of-lie) layer of a semiconductor device.

5. The method of claim 1, wherein the initial thickness T of the capacitor insulating layer is in a range of about 3 nm to about 10 nm, and wherein the thickness $T_1$ of the layer of metallic material is about 3 nm or less.

6. The method of claim 1, wherein applying a surface treatment to the surface of the capacitor insulating layer is implemented by at least one of a plasma bombardment process, an ion implantation process, a gas clusterion beam (GCIB) process, and a neutral atom beam (NAB) technique.

7. The method of claim 1 wherein applying a surface treatment to a surface of the capacitor insulating layer comprises bombarding the surface of the capacitor insulating layer with high energy particles to chemically convert an insulating material having an orthorhombic crystal structure into metallic material haying a cubic crystal structure.

8. The method of claim 1, wherein the capacitor insulating layer comprises $Ta_3N_5$ insulating material.

9. The method of claim 8, wherein applying a surface treatment to a surface of the capacitor insulating layer comprises converting the $Ta_3N_5$ insulating material to TaN metallic material.

10. The method of claim 1, wherein the capacitor insulating layer comprises at least one of TaNO, TiNO, AlNO, MnNO, NiNO and WNO insulating material.

11. A method, comprising:
    forming a first capacitor electrode on a substrate;
    forming a capacitor insulating layer over the first capacitor electrode, wherein the capacitor insulating layer is formed with an initial thickness T; and
    applying a surface treatment to a surface of the capacitor insulating layer to convert the surface of the capacitor insulating layer to a layer of metallic material of thickness $T_1$, which is less than T;
    wherein the layer of metallic material comprises a second capacitor electrode.

12. The method of claim 11, wherein the first capacitor electrode, the capacitor insulating layer, and the second capacitor electrode comprise a MIM (metal-insulator-metal) capacitor structure that is formed as part of a MOL (middle-of-the-line) layer of a semiconductor device.

13. The method of claim 11, wherein the first capacitor electrode, the capacitor insulating layer, and the second capacitor electrode comprise a MIM (metal-insulator-metal) capacitor structure that is formed as part of a BEOL (back-end-of-line) layer of a semiconductor device.

14. The method of claim 11, wherein the capacitor insulating layer comprises $Ta_3N_5$ insulating material, and wherein the second capacitor electrode comprises TaN metallic material.

* * * * *